United States

Drenckhan

4,041,477

Aug. 9, 1977

[54] FERROELECTRIC-PHOTOCONDUCTOR OPTICAL STORAGE

[75] Inventor: Jürgen Drenckhan, Jena-Neulobeda, Germany

[73] Assignee: Jenoptik Jena G.m.b.H., Jena, Germany

[21] Appl. No.: 671,601

[22] Filed: Mar. 29, 1976

[30] Foreign Application Priority Data

June 9, 1975 Germany .............................. 186521

[51] Int. Cl.² ....................... G11C 11/22; G11C 11/42
[52] U.S. Cl. ................................... 340/173.2; 350/150
[58] Field of Search .................... 340/173.2; 350/150, 350/160 P; 317/246

[56] References Cited

U.S. PATENT DOCUMENTS 3,444,530  5/1969  Majima .............................. 340/173.2
3,702,215  11/1972  Cummins ........................... 350/150

Primary Examiner—Stuart N. Hecker

[57] ABSTRACT

This invention is concerned with a ferroelectric photoconductive optical storage, comprising a sandwich arrangement constituted by a plurality of alternating ferroelectric and photoconductive layers enclosed between a pair of transmissive layer electrodes. The material of the ferroelectric layers is selected from bismuth titanate, the electrode material from $SnO_2$ or $InO_2$, the layer thickness of the first is about $2\mu$ and of the latter between 200 and 300 A, whereas the photoconductive layers, the material of which is selected from CdS, is about $1\mu$. The layers are produced by sputtering. Such a multi-layer storage ensures a diffraction effectivity of about 10 percent and a resolution of 500 lines per millimeter when phase reading is employed at a wavelength of $\lambda = 6000$ A.

1 Claim, 1 Drawing Figure

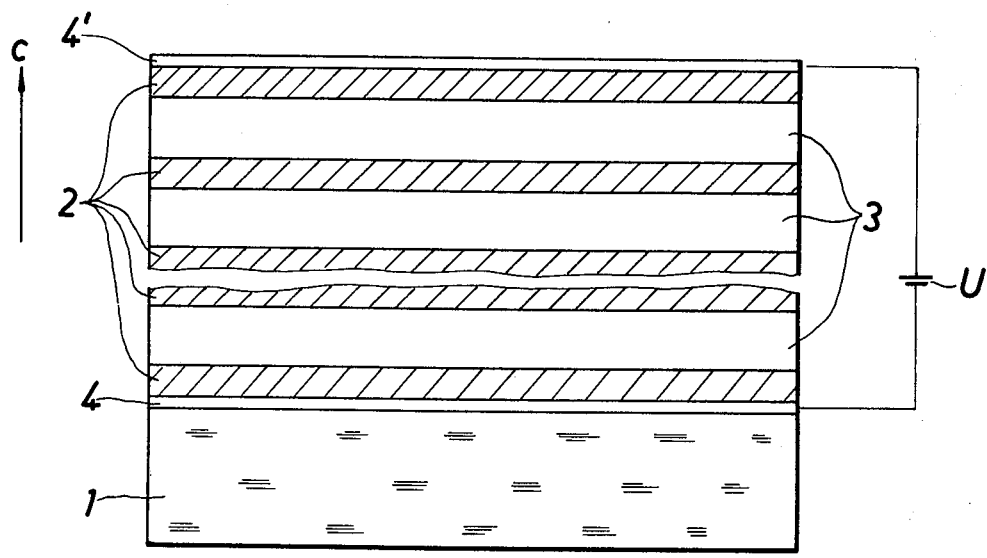

FERROELECTRIC-PHOTOCONDUCTOR OPTICAL STORAGE

This invention concerns an optical storage of the ferroelectric photoconductor type (FF-PC-Type).

Such optical storage types are known. They are composed of ferroelectric monocrystals carrying a photoconductive layer on one of their faces, to which a further transmissive conductive layer, operative as electrode, is atached. The opposite non-covered face of the monocrystal is provided with a second electrode. The ferroelectric medium in such storage cells is selected from bismuth titanate, which offers two remanent polarization components at right angles to each other and which alter their orientation when a suitable voltage is applied. The orientation alteration is connected with a rotation of the optical indicatrix of the crystals, that is, with an alteration of the polarization optical behavior of the crystals. This effect is exploited to store informations in said crystals. To this end a voltage is applied to both electrodes to produce an electric field close to the field power which rotates the orientation in the ferroelectric.

The orientation of the external field is selected to be opposite to the orientation to the internal remanent field of the previously uniformly oriented ferroelectric. When illuminated the electrical conductance increases considerably in the illuminated areas of the photoconductive layer of the storage arrangement.

In consequence thereof the electric field power increases in the illuminated areas of the ferroelectric crystal, and hence alters the polarisation.

After the "write" operation the potential is switched off. The wrote-in information is read, in the event of the amplitude reading, with polarised light, in which the polarisation directions and the angle of incidence have to satisfy definite conditions.

When the polarisation direction in an area is not altered during the "write" operation, and the indicatrix remains in its original position, the polarisation direction is rotated in order to extinguish the light behind the analyser, which is 90° rotated relative to the polariser. The information structure can be erased by a reverse voltage, with respect to the write operation, applied to the crystal and by a full illumination of the storage unit. The known FE-PC-storages are disadvantageous because only a thin layer beneath the surface of the ferroelectric is optically involved in the write operation, hence the diffraction effectivity only amounts to $10^{-4}\%$ (amplitude reading) and 0.02% (phase reading). In this connection diffraction effectivity is to be understood as the input-output relation of the light intensity, which impinges upon the storage cell in the course of the "read" operation, and the light intensity contained in the information output from the storage cell. For it was found out that inhomogeneities in the electric field, when illuminating the storage cell, only occur in the vicinity of the surface of the ferroelectric, whereas in the interiour, the electric field is substantially homogeneous, that is, these regions evade a differentiated polarisation alteration.

Therefore, the known FE-PC-storages are not suitable in cases which require a high storage density. It is an object of the present invention to obviate the above disadvantages.

It is a further object of the present invention to provide a FE-PC-storage arrangement with an optical effective layer thickness which is by a multiple superiour to that in conventional devices and which ensures an increased diffraction effectivity and storage density.

Accordingly, the invention is concerned with a FE-PC-storage characterised in that alternating ferroelectric and photoconductive layers are sandwiched between two transmissive electrodes, in which the layers of the sandwich system lying opposite to said electrodes are photoconductive.

Preferably, the medium of the ferroelectric layers is selected from bismuth titanate.

The storage arrangement according to the invention constituted of alternating thin ferroelectric and photoconductive layers ensures that a plurality of layers is optionally effective when a potential and an illumination is applied thereto.

Model experiments in the electrolytic tank showed considerable differences in the magnitude of the field intensity distribution between illuminated a non-illuminated regions across the entire thickness of the ferroelectric layers.

When a suitable external voltage is applied the entire illuminated bulk is subject to an alteration of the polarisation in the ferroelectric. This results in a one hundred times better diffraction effectivity compared to the previous monocrystal arrangements.

The information is erased by reversing the polarity of the potential applied to the arrangement and simultaneously illuminating the same, or when the arrangement is in the non-illuminated state, in applying a voltage, which corresponds to the switch-over field intensity with respect to the ferroelectric.

In order that the invention may be more readily understood reference is made to the accompanying drawing which illustrates diagrammatically and by way of example one embodiment thereof and in which the FIGURE shows a schematical view of a FE-PC-multilayer storage.

A transparent carrier means 1, the material of which is selected from MgO, of a multi-layer arrangement is followed by an electrode 4, a sandwich parcel of alternating photoconductive layers 2 and ferroelectric layers 3, and a counter electrode 4', mounted on the top of said parcel.

The electrodes 4, 4' are connected to a voltage source U. The material of the photoconductive layers 2 is selected from CdS, Zn, CdSe or ZnSe, that of the ferroelectric layers 3 from bismuth titanate. The layer thickness of an individual photoconductive layer 2 is about 1 $\mu$m, the thickness of an individual ferroelectric layer 3 is about 2 $\mu$m.

As the layer thickness considerably affects the resolution and the diffraction effectivity of the storage arrangement, particular consideration is required. On the one hand, the resolution will increase with a decreasing thickness of the ferroelectric and photoconductive layers. On the other hand, the diffraction effectivity will decrease with a decrease of the layer thickness.

The electrodes 4 and 4' are likewise transparent and their material consists of doped $SnO_2$ or $InO_2$ at layer thicknesses of from 200 to 300 A.

The doping of the layers depends on the required spectral transmissivity and specific conductance. The photoconductive layers 2 arranged between the ferroelectric layers 3 are not provided with contacts. As concerns production, the ferroelectric layers are sputtered, since such a technique permits the production of monocrystal layers of minute stoichiometry and of physical properties similar to those of the bismuth titanate monocrystals.

It is, however, necessary to control the epitaxial growth of the layers in such a manner that the c-axis, designating the remanent polarisation component, is in parallel alignment to the layer normal since only said component, when subject to an external electric field, can be switched by voltages, which do not require considerable technical expenditure.

To produce defined information structures it is a further condition to unidirect the orientation of the remanent polarisation components of the bismuth titanate layers 3 characterised by the c-axis.

Similar to the ferroelectric layers 3, the photoconductive layers and the electrodes 4, 4' are sputter produced. A multi-layer arrangement as disclosed hereinabove, comprising for example, five parcels of photoconductive and ferroelectric layers, yields a diffraction effectivity of 10% when phase reading and a light having a wavelength of $\lambda = 6000$ A are employed.

The resolution amounts to 500 lines per millimeter. When amplitude read-out is employed a similar improvement of the diffraction effectivity is obtained.

I claim:
1. A ferroelectric photoconductor optical storage comprising
   a pair of transmissive electrodes
   a sandwich parcel constituted of an alternating arrangement of ferroelectric layers and photoconductive layers,
      said pair of transmissive electrodes enclosing said sandwich parcel and being oppositely located relative to photoconductive layers out of said alternating arrangement,
      said ferroelectric layers being selected from bismuth titanate.

* * * * *